United States Patent [19]

Fujii et al.

[11] Patent Number: 5,063,423
[45] Date of Patent: Nov. 5, 1991

[54] SEMICONDUCTOR MEMORY DEVICE OF A FLOATING GATE TUNNEL OXIDE TYPE

[75] Inventors: Tetsuo Fujii, Toyohashi; Minekazu Sakai, Aichi; Akira Kuroyanagi, Okazaki, all of Japan

[73] Assignee: Nippondenso Co., Ltd., Kariya, Japan

[21] Appl. No.: 567,760

[22] Filed: Aug. 15, 1990

Related U.S. Application Data

[63] Continuation-in-part of Ser. No. 344,605, Apr. 28, 1989, Pat. No. 5,017,979.

[51] Int. Cl.$^5$ .............. H01L 29/68; H01L 29/34; H01L 29/78; G11C 17/00
[52] U.S. Cl. ................ 357/23.5; 357/54; 357/23.15; 365/104
[58] Field of Search ............ 357/23.5, 54, 23.15; 365/104

[56] References Cited

U.S. PATENT DOCUMENTS

| | | | |
|---|---|---|---|
| 4,688,078 | 8/1987 | Hseih | 357/23.15 |
| 4,774,197 | 9/1988 | Haddad et al. | 437/27 |
| 4,812,898 | 3/1989 | Sumihiro | 357/23.5 |

Primary Examiner—Rolf Hille
Assistant Examiner—Robert P. Limanek
Attorney, Agent, or Firm—Cushman, Darby & Cushman

[57] ABSTRACT

A tunnel insulating film of a three-layer structure, wherein an oxide film is interposed between nitrided oxide films, is formed on the surface of a semiconductor substrate. A first polysilicon film serving as a low-concentration impurity region is formed on the tunnel insulating film. An oxide film is formed on that region of the first polysilicon film, which corresponds to the tunnel insulating film, the oxide film having such a thickness that the film can serve as a stopper for impurity diffusion and can allow electrons to pass through. A second polysilicon film, having an impurity concentration higher than that of the first polysilicon film, is formed on the oxide film. The first and second polysilicon films constitute a floating gate. A third polysilicon film serving as a control gate is formed above the second polysilicon film, with an insulating layer interposed therebetween.

9 Claims, 10 Drawing Sheets

SEMICONDUCTOR MEMORY DEVICE OF A FLOATING GATE TUNNEL OXIDE TYPE

CROSS-REFERENCES TO THE RELATED APPLICATIONS

This application is a continuation-in-part of application Ser. No. 344,605, filed on Apr. 28, 1989, now U.S. Pat. No. 5,017,979, issued May 21, 1991.

BACKGROUND OF THE INVENTION

1. Field of the Invention

The present invention relates to a semiconductor memory device and a method of manufacturing the same and, more particularly, to a semiconductor memory device of a so-called FLOTOX (Floating Gate Tunnel Oxide) type having a structure in which a tunnel region having a thin insulating film is locally formed between the drain and floating gate of a memory transistor and a method of manufacturing the same.

2. Description of the Related Art

In a semiconductor memory device, e.g., an $E^2$-PROM, a insulating film consisting of a silicon oxide film is formed on a surface of a silicon semiconductor substrate, and a thin film portion is locally formed as a tunnel oxide film on the insulating film. A floating gate is formed on this thin tunnel oxide film. In addition, a control gate is formed on the floating gate through a silicon oxide film serving as an insulating film.

In a semiconductor memory device arranged into such a FLOTOX type device, demands have arisen for an improvement in endurance (the number of times of writing and erasing) characteristics and in breakdown characteristics of a tunnel insulating film. For example, U.S. Pat. No. 4,490,900 discloses a means to improve such characteristics, i.e., discloses a technique of forming a three-layer structure consisting of a tunnel oxide film, a nitrided oxide film, and an oxide film.

After experiments with an FLOTOX type $E^2$PROM having the above-described structure and examination of the results, the present inventors obtained the following conclusion. A tunnel oxide film generally has a thickness as small as 50 to 150 Å. For this reason, if the concentration of an impurity, e.g., phosphorus, of a floating gate on the tunnel oxide film is excessively high, phosphorus is introduced into the tunnel insulating film. It was found, therefore, that the withstand voltage of the tunnel insulating film with respect to electron injection was lowered, and the number of times of rewriting was reduced due to breakdown of the tunnel insulating film. In addition, variations in rewriting amount occurred.

In contrast to this, if the concentration of phosphorus of the floating gate is decreased, introduction of the impurity into the tunnel insulating film is suppressed, and the above problem may be solved. However, in the above-described conventional technique, the impurity concentration of the floating gate is not designed to be low, but is set to be high instead due to the following reasons.

In $E^2$PROMs, a polyoxide film obtained by oxidizing a floating gate is generally used as an insulating film between the floating gate and a control gate. If the phosphorus concentration of the floating gate is low when it is oxidized, the asperity of a surface of the floating gate upon oxidation is increased. In addition, a polyoxide film at an edge portion of the floating gate is made thinner, and the edge portion is made further acute, thereby decreasing a withstand voltage between the floating gate and the control gate. The edge portion is especially susceptible to such influences, and hence a high voltage for rewriting the $E^2$PROM cannot be applied.

In addition, if an oxidation temperature for forming a polyoxide film on the floating gate is increased, the withstand voltage tends to be increased. However, redistribution of an impurity of the tunnel insulating film in a transistor region occurs, and a problem is posed in terms of a high packing density for microfabrication.

According to the method disclosed in U.S. Pat. No. 4,490,900, when an oxide film is nitrided, forming a three-layer tunnel insulating layer, a part of the memory transistor and the oxide film surrounding the memory transistor (i.e., the gate oxide film of the memory transistor and the gate oxide film of the select transistor) are also inevitably nitrided. As a result, carrier mobility is lowered by coulomb dispersion which is caused possibly by a fixed charge being introduced into the gate oxide film, and thus the operation speed of the fabricated semiconductor device is lowered.

SUMMARY OF THE INVENTION

It is an object of the present invention to provide a semiconductor memory device which can reliably suppress degradation in endurance characteristics, breakdown characteristics of a tunnel insulating film, and the like due to introduction of an impurity into the tunnel insulating film, and a method of manufacturing the same.

It is another object to provide a semiconductor memory device in which the withstand voltage of an oxide film between a floating gate and a control gate is increased without causing redistribution of an impurity in a tunnel insulating film.

It is still another object to provide a semiconductor memory device wherein electrons moving between a floating gate and a transistor region through a tunnel insulating film are not easily trapped, and the endurance characteristic of an EEPROM and the insulation breakdown characteristic of the tunnel insulating layer are improved.

According to a semiconductor memory device of the present invention, a tunnel insulating film is provided between a substrate of a memory transistor and a floating gate. The tunnel insulating layer has a three-layer structure in which an oxide film is interposed between nitrided oxide films. The floating gate and a control gate are laminated on the tunnel insulating film. When a voltage is applied to the control gate, carriers are injected from the semiconductor substrate into the floating gate through the tunnel insulating film.

The floating gate is divided into a first region, situated to adjoin the tunnel insulating film, and a second region. The first region has an impurity concentration lower than that of the second region. An oxide film is formed between the first and second regions.

The tunnel insulating film is formed in the following manner. A thermal oxide film is formed on the semiconductor substrate. The thermal oxide film is nitrided to form a three-layer film. The three-layer film, except a portion thereof, is removed. Thus, the tunnel insulating film is formed. Therefore, the gate oxide film for forming a memory transistor, which is situated at the periphery of the tunnel insulating film, and the gate oxide film of the select transistor are not nitrided, and the mobility of carriers is not lowered.

DETAILED DESCRIPTION OF THE PREFERRED EMBODIMENTS

Figure 1A:
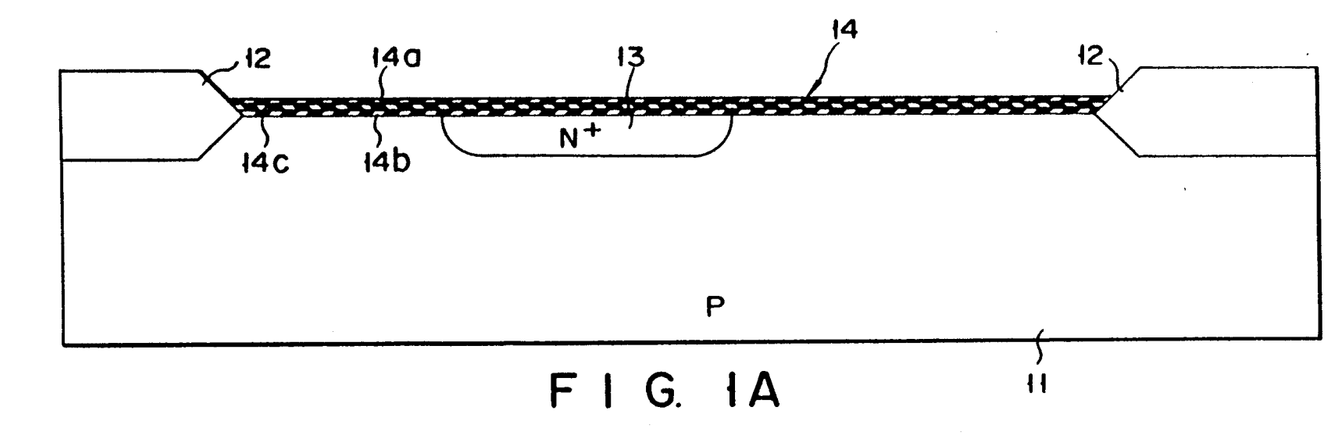
FIGS. 1A to 1G are sectional views, showing a structure of a semiconductor memory device according to an embodiment of the present invention, for sequentially explaining the steps in manufacturing the same.

In this embodiment, an FLOTOX type semiconductor memory device will be described in accordance with its manufacturing steps. As shown in FIG. 1A, an element region is formed by field oxide films 12 on the major surface of a semiconductor substrate 11 consisting of a p-type silicon single crystal. An $n^+$-type diffusion region 13 serving as the drain of a memory transistor is formed in this element region. After a thermal oxide film having a thickness of 50 to 150 Å is formed on the surface of the substrate 11, the resultant structure is subjected to a nitriding treatment by lamp heating in an atmosphere of $NH_3$ to form an insulating film 14 having a three layer structure constituted by a nitrided oxide films 14a and 14b, and an oxide film 14c.

Figure 1B:
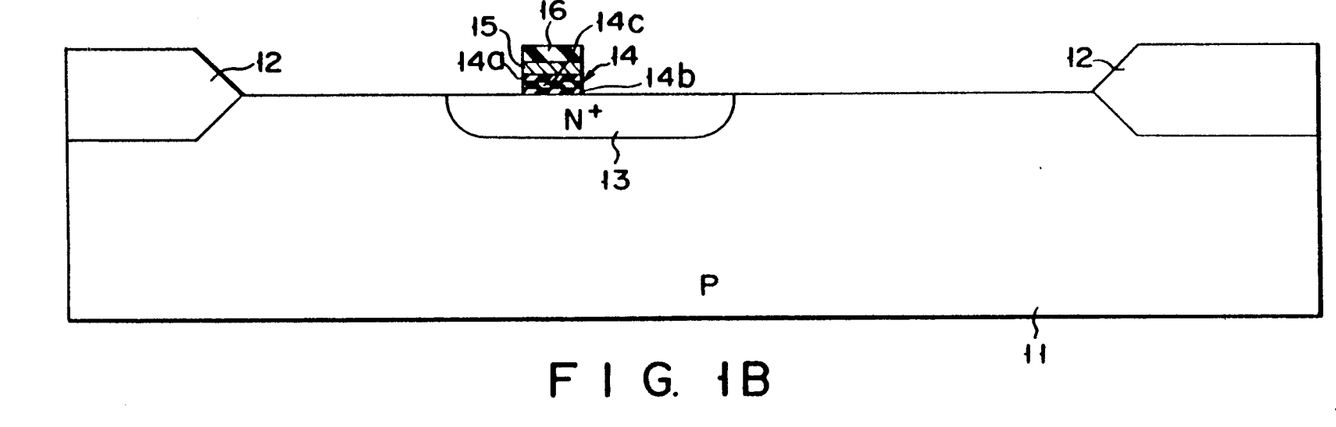

After the insulating film 14 is formed in this manner, a first polysilicon film 15 of a thickness of 200 to 4,000 Å is formed on the insulating film 14, as shown in FIG. 1B. The entire first polysilicon film 15 contains low-concentration impurities (phosphorus, arsenic, etc.). An insulating film 16 consisting of $Si_3N_4$ is deposited on the first polysilicon film 15 to a thickness of 200 to 1,000 Å by LPCVD (Low-Pressure Chemical Vapor Deposition). Thereafter, the insulating film 16 and the first polysilicon film 15 are etched by normal photolithography or etching, e.g., dry etching so as to leave only a region serving as a prospective tunnel region in correspondence with the drain region. Subsequently, the nitrided oxide film 14 is removed by using a hydrofluoric acid wet etchant to expose the surface of the semiconductor substrate 11.

Figure 1C:
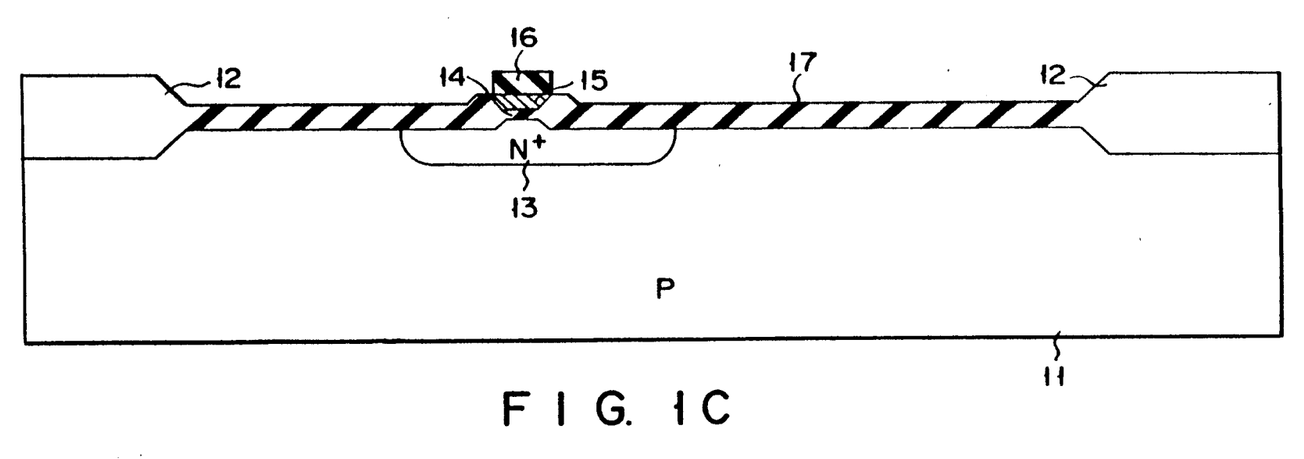
Figure 1D:
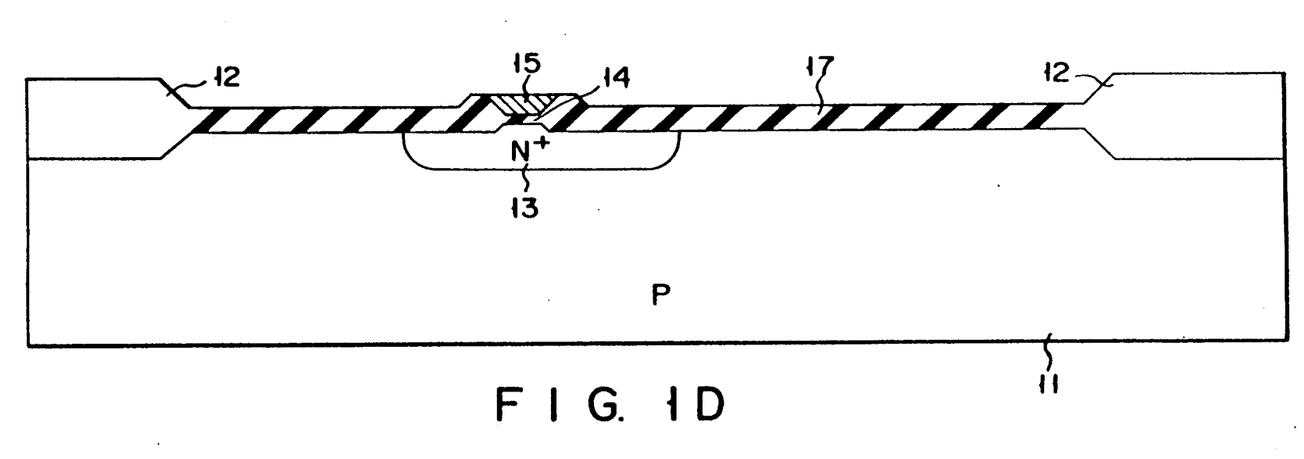
Figure 1E:
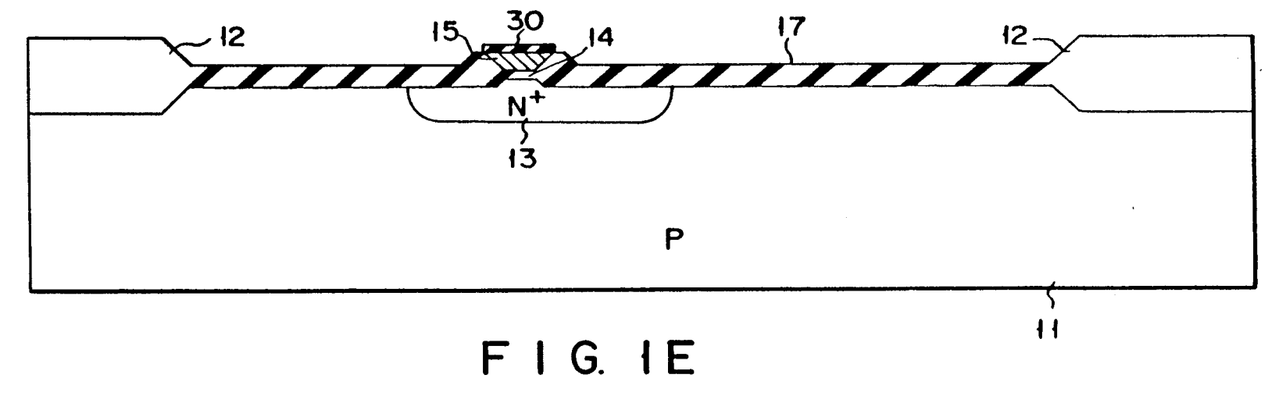

As shown in FIG. 1C, a thermal oxide film $(SiO_2)$ 17 having a thickness of, e.g., 300 to 700 Å is formed in a dry $O_2$ atmosphere at 1000° C. on the resultant structure by using the insulating film 16 as a mask. In FIG. 1C and the following figures, the nitrided oxide film 14 is shown as a single-layer film for the purpose of simplicity. After the thermal oxide film 17 is formed in this manner, the insulating film 16 above the tunnel region is removed by using hot phosphoric acid, as shown in FIG. 1D, thus exposing the first polysilicon film 15.

After the polysilicon layer film 15 is exposed, a oxide film 30 having a thickness of 5 to 20 is formed at least on the polysilicon film 15. The oxide film 30 may be a natural oxide film or an oxide film formed by use of liquid of $H_2O_2$—$H_2SO_4$ or by use of an acid chemical. In this embodiment, the oxide film 30 is formed on the polysilicon film 15. The film 30 may be formed by means of CVD or other methods, only if it can serve as a stopper for impurity diffusion and it allows electrons to pass through. For example, a silicon nitride film or oxynitride film may be formed by means of LPCVD, or a titan nitride (TiN) film or the like may be formed by means of reactive etching, and the formed film, excluding a predetermined portion, may be removed by etching. The thickness of the formed film is not limited to 5 to 20 Å, if it allows the passing of electrons.

Figure 1F:
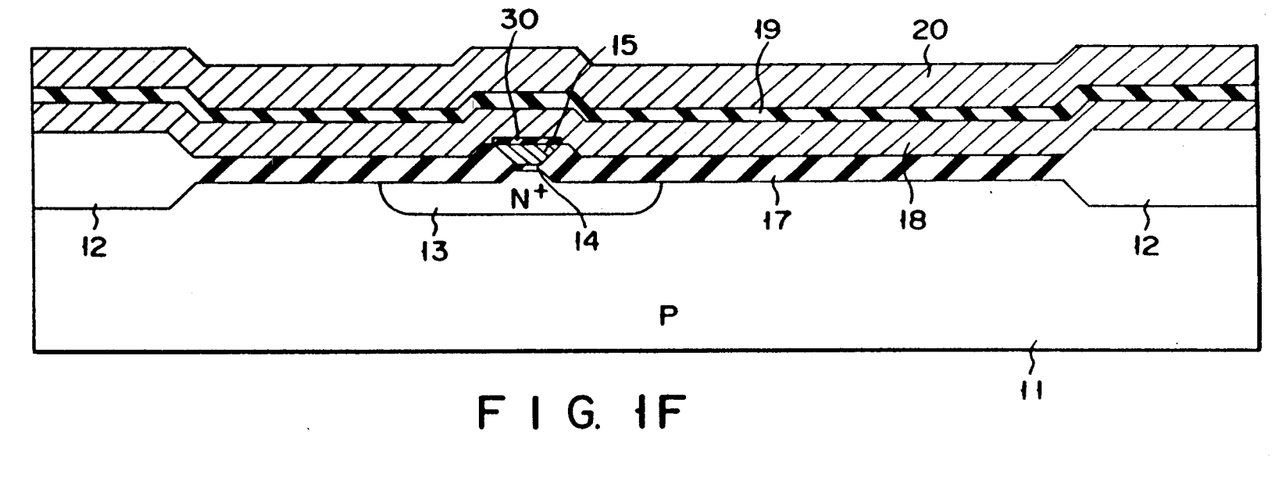

Subsequently, as shown in FIG. 1F, a second polysilicon film 18 containing an impurity (e.g., phosphorus and arsenic) at a high concentration is deposited on the resultant structure to a thickness of 1,000 to 4,000 Å by means of LPCVD on the surface of the semiconductor substrate 11. Thereafter, the second polysilicon film 18 is oxidized to form an insulating film 19 ($SiO_2$). A third polysilicon film 20 is formed on the insulating film 19 by the same process as that for the second polysilicon film 18.

Figures 1G, 2:
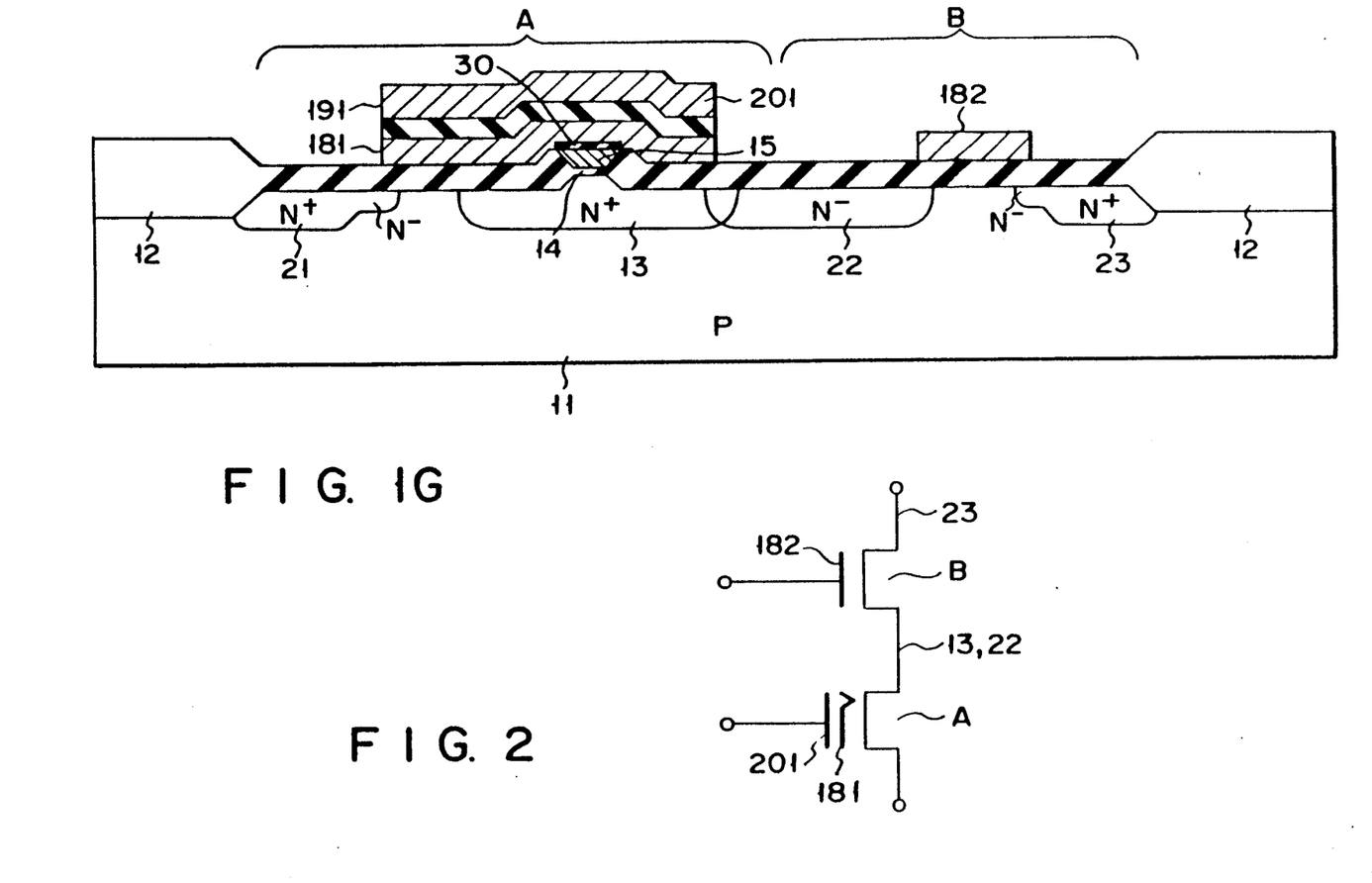
FIG. 2 is an equivalent circuit diagram of the semiconductor memory device manufactured n the embodiment shown in FIGS. 1A to 1F.

When the first to third polysilicon films 15, 18, and 20 are formed in this manner, the first to third polysilicon films 15, 18; and 20 and the insulating film 19 are selectively removed, as shown in FIG. 1G, to form a floating gate 181 consisting of the second polysilicon film 18, which will constitute a memory transistor A together with the first polysilicon film 15. A control gate 201 is then formed by the third polysilicon film 20, and an insulating film 191 is formed between the floating gate 181 and the control gate 201. In correspondence with a selection transistor B region, a gate electrode 182 of the selection transistor B is formed by the second polysilicon film 18.

When the floating gate 181, the control gate 201, and the gate 182 of the selection transistor are formed in this manner, ions are implanted into the semiconductor substrate 11 to form an $n^+$-type source region 21 of the memory transistor A, and an $n^-$-type source region 22 and a drain region 23 of the selection transistor B.

The impurity concentration of the second polysilicon film 18 constituting the floating gate 181 is higher than that of the first polysilicon film 15. An oxide film 30 interposed between the first polysilicon film 15 and the second polysilicon film 18 makes it difficult for the impurity in the second polysilicon film 18 to diffuse into the first polysilicon film 15.

Since the thickness of the oxide film 30 is sufficiently small, it allows tunneling of electrons, and there is no operational problem.

According to the semiconductor memory device in this embodiment, the tunnel insulating film 14 has a three-layer structure (nitride films 14a and 14b and oxide film 14c), as disclosed in U.S. Pat. No. 4,490,900. Electrons, which move between the N+type diffusion region and the first polysilicon film 15 through the tunnel insulating film 14, are not easily trapped. Thus, the endurance characteristic of the EEPROM and the insulation breakdown characteristic of the tunnel insulating film 14 are improved.

According to the method disclosed in U.S. Pat. No. 4,490,900, when an oxide film is nitrided, forming a three-layer tunnel insulating layer, a part of the memory transistor and the oxide film surrounding the memory transistor (i.e., the gate oxide film of the memory transistor and the gate oxide film of the select transistor) are also inevitably nitrided. As a result, carrier mobility is lowered by coulomb dispersion which is caused possibly by a fixed charge being introduced into the gate oxide film, and thus the operation speed of the fabricated semiconductor device is lowered.

By contrast, in the method according to the above-described embodiment, after the three-layer insulating film 14 is formed by nitriding the thermal oxide film, most part of the film 14 is removed thereby forming tunnel insulating film. Thus, it is not necessary to nitride the gate oxide film 17 of the selection transistor, and the problems of the invention of U.S. Pat. No. 4,490,900 do not occur in the present invention.

FIG. 2 shows an equivalent circuit of an E²PROM having the above-described arrangement.

According to the E²PROM having such a structure, since the impurity concentration of the first polysilicon film 15 formed in contact with the insulating film 14 serving as a tunnel insulating film is set to be low, introduction of the impurity into the insulating film 14 is suppressed. Therefore, the endurance characteristics and the breakdown characteristics of the tunnel insulating film can be improved.

Since the impurity concentration of the second polysilicon film 1 constituting the floating gate 181 together with the first polysilicon film 15 is set to be high, the surface of the floating gate 181 is made relatively smooth. In addition, a polyoxide film (not shown) can be formed on an edge portion of the floating gate 181 in an excellent state. As a result, the floating gate 181 can be formed by thermal oxidation, and hence the withstand voltage of the insulating film 19 can be increased.

Note that if a portion of the floating gate 181 in contact with the insulating film 19 formed by thermal oxidation upon formation of the second polysilicon film 18 contains an impurity at a high concentration, the withstand voltage can be increased in the same manner as described above.

In this E²PROM, the high impurity concentration range of the floating gate 181 is determined in association with the formation process of the insulating film 19 described with reference to FIG. 1F. If the oxidation temperature is set to be, e.g., 950° to 1,050° C. in consideration of redistribution of the impurity, the impurity concentration is preferably set to be about $4.1 \times 10^{20} cm^{-3}$ or more.

Figure 3:
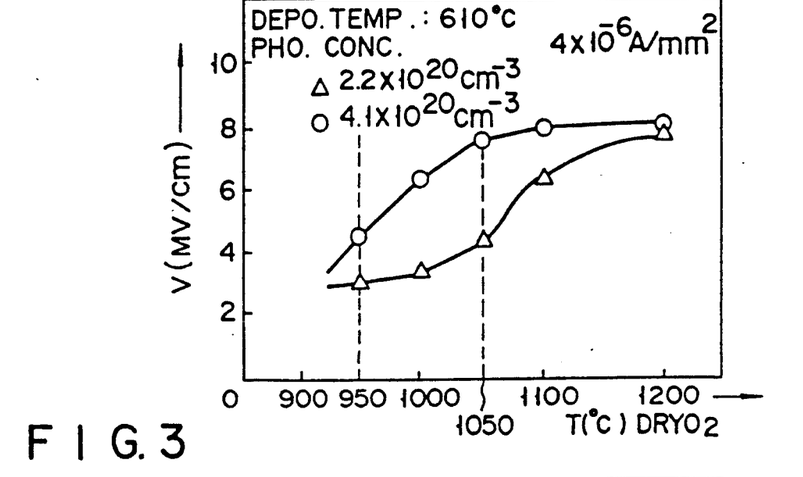
FIG. 3 is a graph showing a relationship between the oxidation temperature and breakdown voltage in the manufacturing steps in FIGS. 1A to 1F.

FIG. 3 shows a relationship between an oxidation temperature T and a breakdown voltage V of the insulating film 19 when a positive potential is applied to the control gate 201 consisting of the third polysilicon film in the E²PROM having the arrangement shown in FIG. 1G. Referring to FIG. 3, triangle plots represent the characteristics of a sample obtained by setting the phosphorus concentration of the floating gate 181 to be $2.2 \times 10^{20} cm^{-3}$, whereas circle plots represent the characteristics of a sample obtained by setting the phosphorus concentration to be $4.1 \times 10^{20} cm^{-3}$. In this case, a precipitation temperature of polysilicon is 610° C., and a withstand voltage determination current value is $4 \times 10^6$ A/mm². Generally, a breakdown voltage is set to be 4 MV/cm or more in consideration of rewriting characteristics. The concentration value of $4.1 \times 10^{20} cm^{-3}$ is set on the basis of this breakdown voltage as are reference.

Figure 4:
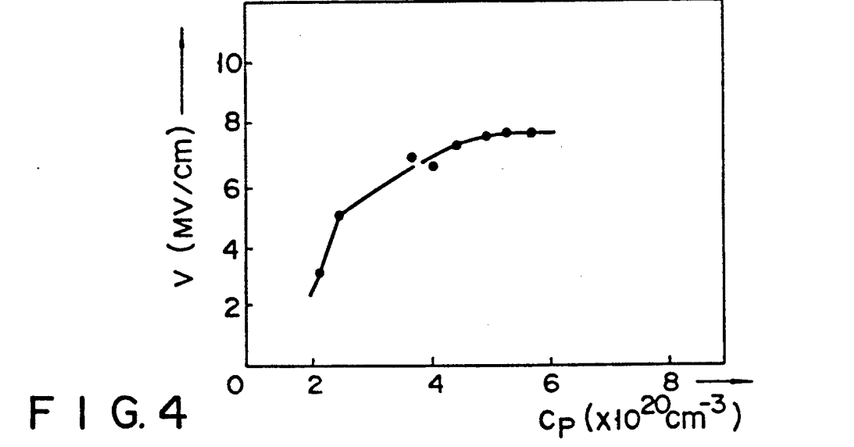
FIG. 4 is a graph showing a relationship between the phosphorus concentration and breakdown voltage.

FIG. 4 shows a relationship between a phosphorus concentration Cp and a breakdown voltage V of the floating gate 181 constituted by the second polysilicon film when the insulating film 19 is formed by performing thermal oxidation in an atmosphere of dry $O_2$ at 1,000° C. It is understood from this graph that the breakdown voltage V is increased with an increase in phosphorus concentration.

Note that if the oxidation temperature for the insulating film 19 falls outside the range of 950° to 1,050° C., an impurity concentration in the floating gate 181 constituted by the second polysilicon film is set on the basis of FIGS. 3 and 4.

In addition, as long as the low impurity concentration range of the first polysilicon film 15 is set below the impurity concentration of the second polysilicon film 18 constituting the floating gate 181 set in the above-described manner, a certain effect can be expected. However, the impurity concentration of the floating gate 181 is preferably set to be as low as possible.

Figure 5:
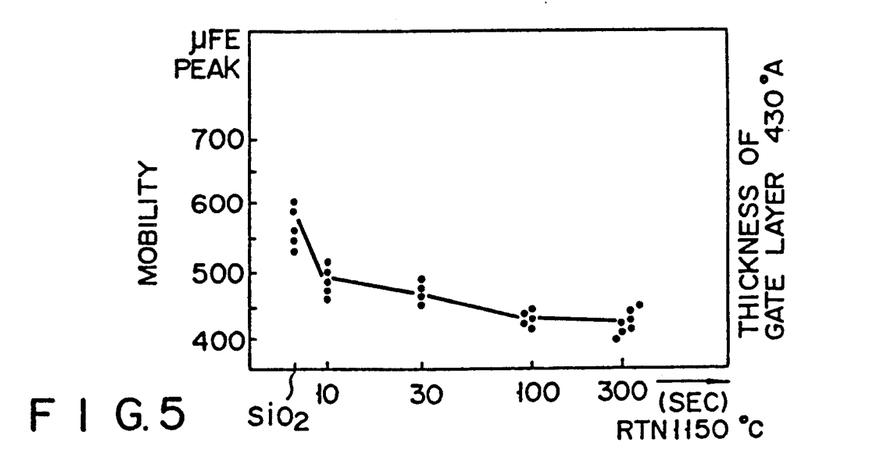
FIG. 5 is a graph showing a relationship between the nitriding time and mobility.

FIG. 5 shows a relationship between a nitriding time (RTN) and a mobility $\mu FE$ when a 430-Å thick gate oxide film is nitrided in an atmosphere of $NH_3$ at 1,150° C. by using a halogen lamp. As is apparent from FIG. 5, the mobility is decreased as the nitriding time is prolonged.

According to the E²PROH disclosed in this embodiment, a thermal oxide film is nitrided to form the insulating film 14 having a three-layer structure, and the insulating film is then locally removed to form a tunnel insulating film. Therefore, the thermal oxide film 17 is not nitrided, and the above-described problem is not posed.

In this embodiment, the impurity concentration of the first polysilicon film 15 in contact with the insulating film 14 serving as a tunnel insulating film is decreased by the above-described method. In addition to this method, for example, a first polysilicon film 15 containing no impurity is formed, and an impurity is then diffused therein by ion implantation or by using a gaseous impurity source.

Figure 6:
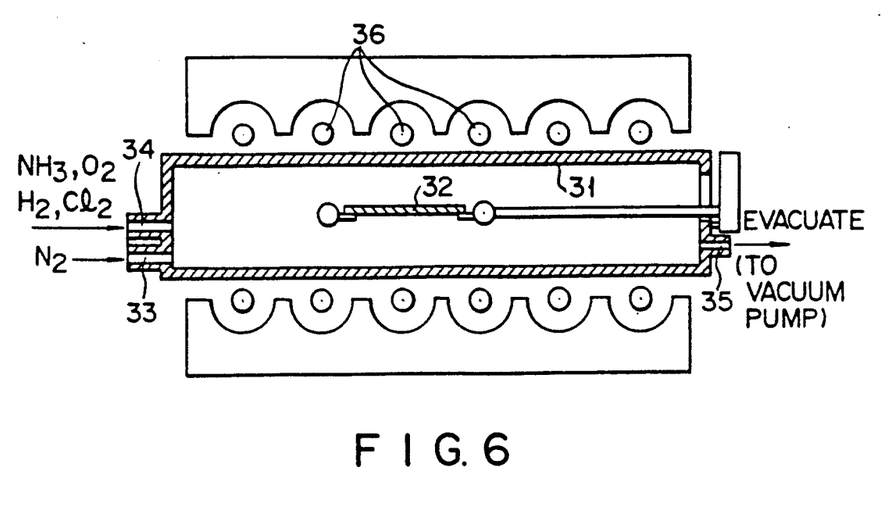
FIG. 6 is a view, showing an arrangement of a chamber, for explaining a means for forming an insulating film in the manufacturing steps in FIGS. 1A to 1F.

In this case, the insulating film 14 has a three-layer structure so that excellent endurance characteristics can be obtained without making the tunnel insulating film especially thin. A method of manufacturing this insulating film will be described below. As shown in FIG. 6, a silicon semiconductor wafer 32 is inserted in a quartz chamber 31. Gas inlet ports 33 and 34 are formed in the chamber 31. $N_2$ is introduced through the inlet port 33, whereas reactive gases such as $NH_2$, $O_2$, $H_2$, and Cl are selectively introduced through the inlet port 34. In addition, an exhaust port 35 is formed in the chamber 31, so that the chamber 31 is selectively evacuated by a vacuum pump (not shown) through the exhaust port 35.

Since a heating mechanism constituted by halogen lamps 36 is arranged around the quartz chamber 31, the semiconductor wafer 32 is rapidly heated by the halogen lamps 36.

Note that the heating temperature in the quartz chamber 31 is monitored so that the halogen lamps 36 are controlled to set the heating temperature to a target value, although a detail of such a mechanism is not shown in FIG. 6. In addition, arc lamps may be used in place of the halogen lamps.

Figure 7:
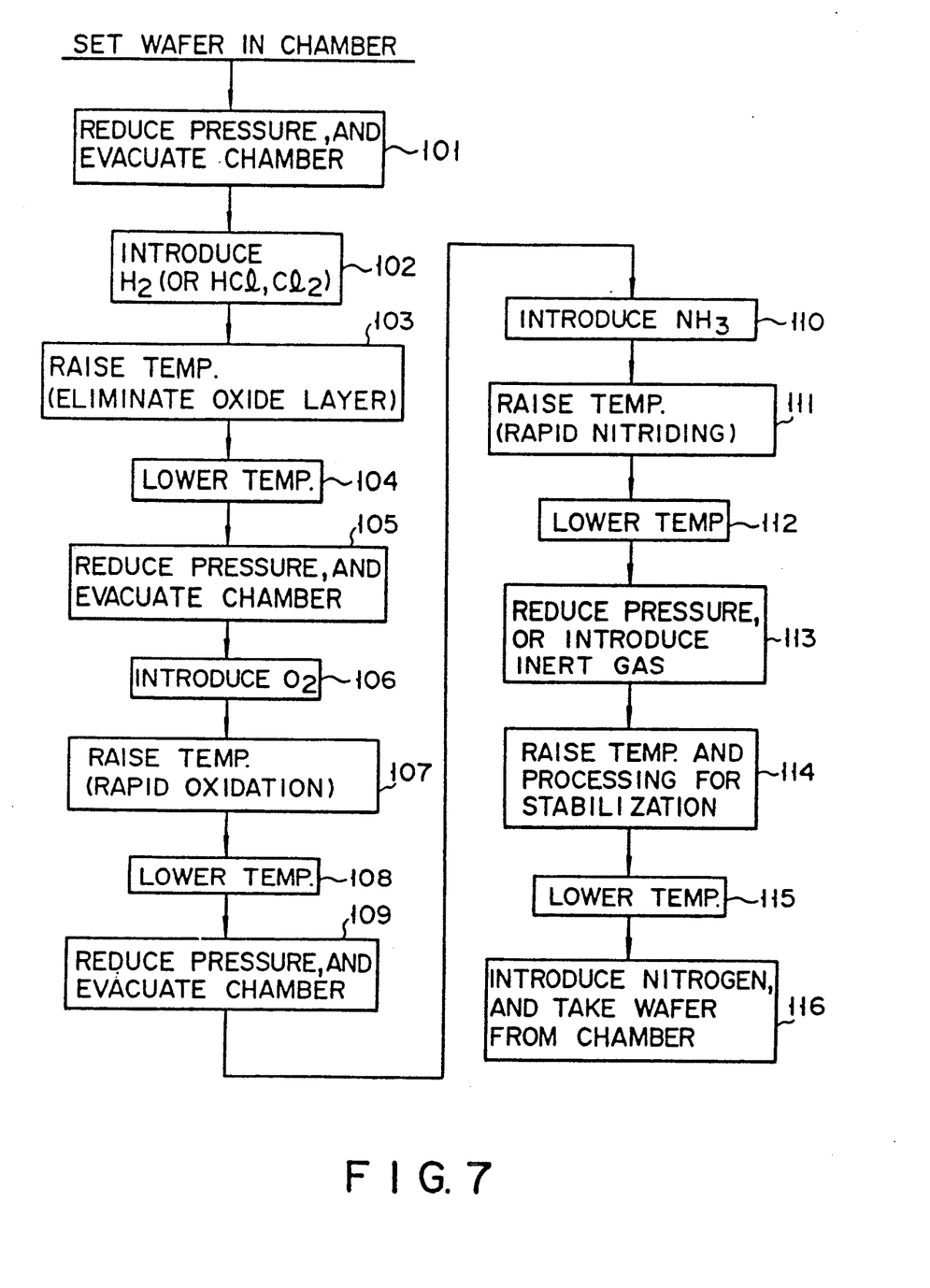
FIG. 7 is a flow chart for explaining the steps in forming the insulating film.

FIG. 7 is a flow chart of a process for forming a tunnel oxide film in a state wherein the semiconductor wafer 32 is set in the quartz chamber 31. The flow advances to step 101 while the wafer is set in the chamber. In this step, the chamber 31 is evacuated. When the chamber 31 is evacuated to a vacuum state, a reactive gas such as $H_2$ or HCl is introduced into the chamber as shown in step 102, and the flow then advances to step 103 of raising the temperature of the chamber.

In this third step, a natural oxide film which is inferior in quality formed on a surface of the semiconductor wafer 32 due to air or by a chemical treatment is removed. For example, in step 103, the wafer 32 is treated at 1,150° C. for 60 seconds. After the removal treatment of such a natural oxide film, the temperature of the chamber 31 is lowered in the fourth step, i.e., step 104.

When the temperature of the chamber 31 is lowered in step 104, the chamber 31 is evacuated in the fifth step, i.e., step 105. $O_2$ is then introduced in the chamber 31 in the sixth step, i.e., step 106.

When the semiconductor wafer 32 in the chamber 31 is set in an oxygen atmosphere in this step, the temperature of the wafer 32 in the chamber 31 is raised in the seventh step, i.e., step 107 so as to rapidly oxidize the surface of the wafer 32, thus forming a silicon oxide film on the surface of the wafer 32. The temperature raising treatment in this step is performed by using the halogen lamps 36 so as to perform especially rapid temperature raise. The silicon oxide film is formed by rapidly oxidizing the surface of the wafer 32.

The temperature raise/oxidation treatment in the seventh step is performed at 1,150° C. so as to form a silicon oxide film having a thickness of 70 to 90 Å.

When the silicon oxide film is formed on the surface of the semiconductor wafer 32 in this manner, the temperature of the wafer 32 is lowered in the eight step, i.e., step 108. In addition, the chamber 31 is evacuated in the ninth step, i.e., step 109.

A nitriding reactive gas $NH_3$ is introduced in the chamber 31 in the 10th step, i.e., step 110. When such a nitriding reactive gas is introduced, the semiconductor wafer 32 is rapidly heated by the rapidly heating means using the halogen lamps 36 in the 11th step, i.e., step 111 so as to rapidly nitride the silicon oxide film. This nitriding step is performed by a heating treatment at 1,150° C. for 10 seconds.

When the nitriding treatment is performed in this manner, the temperature of the chamber 31 is lowered in the 12th step, i.e., step 112. In addition, the chamber 31 is evacuated to about $10^{-3}$ Torr to several tens of Torr or an inert gas such as nitrogen is introduced in the 13th step, i.e., step 113. In the 14th step, i.e., step 114, the semiconductor wafer 32 is rapidly heated up to 900° to 1,200° C. within 30 to 300 seconds by the rapidly heating means constituted by the halogen lamps 36, thereby performing a stabilization treatment. Thereafter, the temperature of the chamber 31 is lowered in the 15th step, i.e., step 115. Nitrogen is then introduced in the chamber 31 in the 16th step, i.e., step 116, and the wafer 32 is taken out from the chamber 1.

Figure 8:
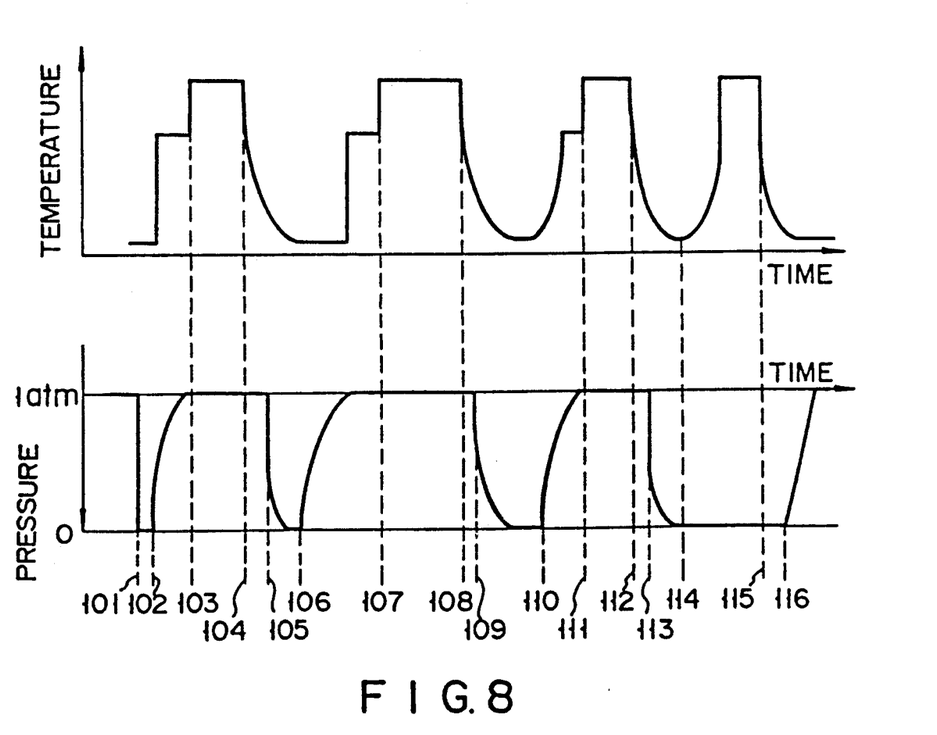
FIG. 8 is a graph showing the temperature and pressure in the chamber as a function of time.

FIG. 8 shows states of temperatures and pressure in the chamber 31 in the respective steps of forming the above-described tunnel oxide film. The reference numerals in FIG. 8 respectively correspond to the step numbers in FIG. 7.

In the $E^2PROM$ having the structure shown in FIG. 1G, writing and erasing of data are performed by supplying/extracting electrons in/from the floating gate 181 through the tunnel insulating film 14.

In a data writing operation of supplying electrons in the floating gate 181, for example, a voltage of 18 to 25 V is applied to the control gate 201, and the drain, the source, and the substrate 11 are set at 0 V. In addition, in a data erasing operation of extracting electrons from the floating gate 181, the control gate 201, the source, and the substrate 11 are set at 0 V, and a voltage of 18 to 25 V is applied to the drain.

Figure 9:
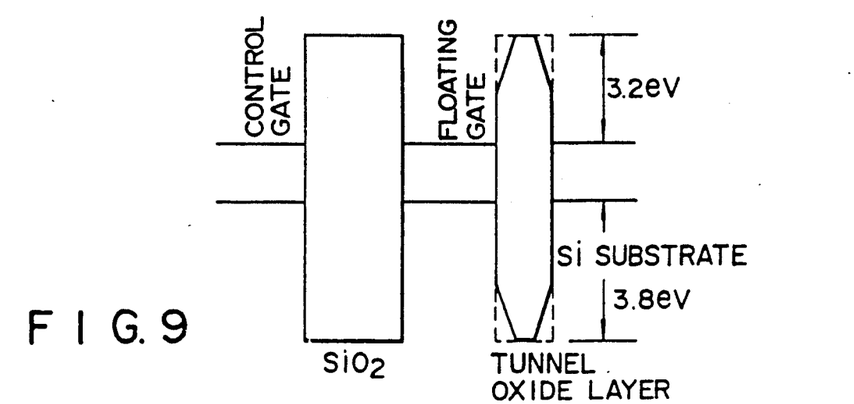
FIG. 9 is a band diagram showing a memory element of a manufactured $E^2PROM$.

The tunnel oxide film formed in this manner has a structure represented by a band diagram shown in FIG. 9, wherein a surface of the tunnel oxide film and an interface side of the silicon substrate are formed into nitrided oxide films. Therefore, as indicated by broken lines in FIG. 9, the barrier heights of tunnel portions at the surface of the tunnel oxide film and the interface portion are made lower than those of a tunnel oxide film consisting of only a silicon oxide ($SiO_2$) film.

As described above, the tunnel insulating film having a three-layer structure in which nitrided oxide films are formed on the upper and lower surfaces of a silicon oxide film can be formed in such a manner that the silicon oxide film formed in the seventh step, i.e., step 107 is rapidly heated by the halogen lamps in an atmosphere of $NH_3$ as in the 10th and 11th steps, i.e., steps 110 and 111.

The above-described nitriding means is described in, e.g., Yasushi Naito et al., J, Vac. Technol, B5(3), May/Jun 1987, p. 633. When the nitriding time is set to be short, nitrided oxide films are formed on the surface of a silicon oxide film and an interface. With the elapse of time, the entire oxide film becomes nitrided. This phenomenon was confirmed by an experiment performed by the present inventors.

Figure 10:
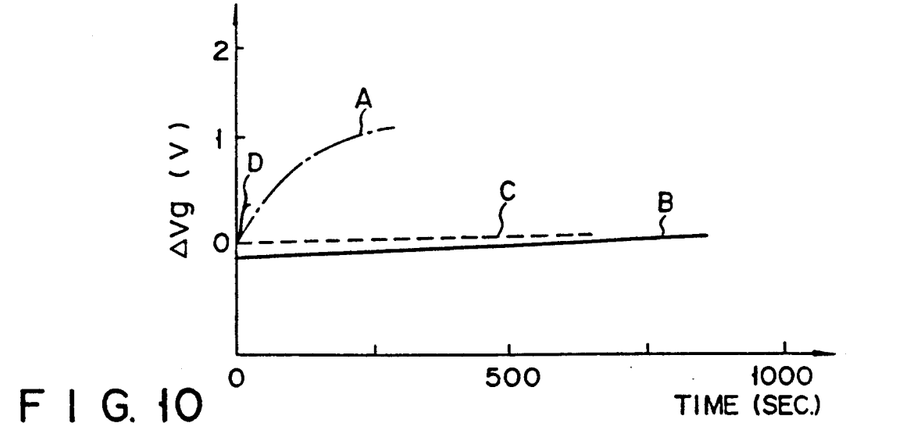
FIG. 10 is a graph showing results obtained by experiments with a trap amount of electrons.

FIG. 10 shows results obtained by the experiment. In this case, a current density J is set as "$J=64$ mA/cm$^2$", and a thickness Tox of a tunnel oxide film is set to be 80 Å.

As is apparent from FIG. 10, a curve A represents a case wherein a rapid nitriding time is set to be "0 seconds" and hence no rapid nitriding treatment is performed. In this case, a voltage Vg is increased with the elapse of time. The voltage Vg corresponds to an amount of charge trapped in the tunnel oxide film.

In contrast to this, curves B and C respectively represent cases wherein rapid nitriding is performed at 1,150° C. for 10 seconds and at the same temperature for 30 seconds. In these cases, the voltage Vg undergoes almost no change. However, as indicated by a curve D, if a rapid nitriding treatment is performed for 100 seconds, the voltage Vg is rapidly increased.

If nitrided oxide films are formed on the upper and lower surfaces of a silicon oxide film to form a three-layer structure, the resultant structure is kept in a state wherein a trap amount of electrons is small. In this case, since a drop in threshold voltage in the endurance characteristics is small, even if the number of times of writing and erasing data is increased, stability thereof is maintained.

Figure 11:
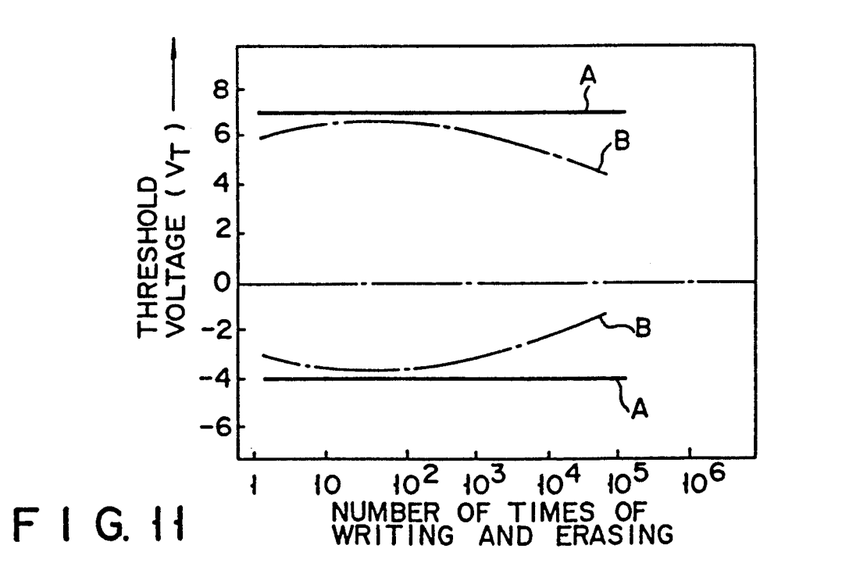
FIG. 11 is a graph showing a comparison between the endurance characteristics of a semiconductor memory device manufactured according to the steps in FIGS. 1A to 1F and those of a conventional device.

FIG. 11 shows endurance characteristics. Referring to FIG. 11, a curve A represents a case wherein a tunnel oxide film has a thickness of 100 Å, and is rapidly nitrided at 1,150° C. for 30 seconds. In this case, a threshold voltage $V_T$ exhibits almost no decrease upon repetition of writing and erasing op rations. In contrast to this, when no nitrided oxide layer is present, the threshold voltage $V_T$ is lowered and a $V_T$ window is narrowed upon repetition of writing and erasing operations, as indicated by a curve B. Therefore, it is clear that variations in threshold voltage $V_T$ can be suppressed by performing rapid nitriding.

By forming a three-layer structure wherein nitrided oxide layers are formed on the upper and lower surfaces of a tunnel oxide film in this manner, endurance characteristics and breakdown characteristics can be improved. As described in the 13th and 14th steps, i.e., steps 113 and 114, since the heat treatment is performed after the rapid nitriding treatment in the 21st step, the above characteristics can be further improved.

After the rapid nitriding in the 11th step, i.e., step 111, nonreacted $NH_x$, hydrogen, $H_yO$ compounds, and the like are left in the tunnel oxide film. If these residues are contained in the film, breakdown time may be undesirably shortened due to electron trap. As described in the embodiment, however by performing a heat treatment, the above-described nonreacted residues can be effectively eliminated, as shown in FIGS. 12A to 12C.

Figure 12A:
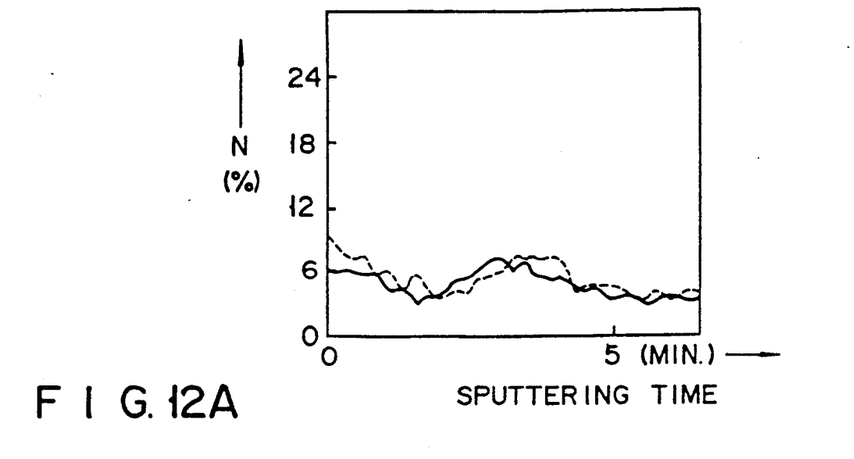
FIGS. 12A to 12C are graphs respectively showing relationships between the sputtering time and nitrogen concentration.
Figure 12B:
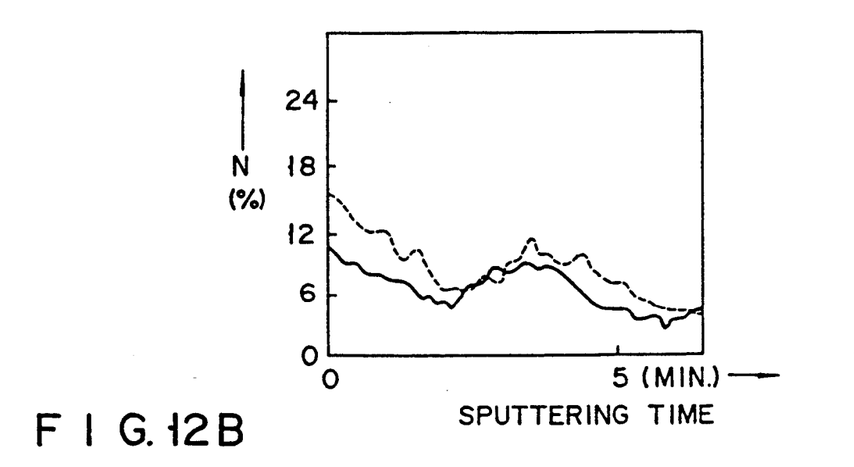
Figure 12C:
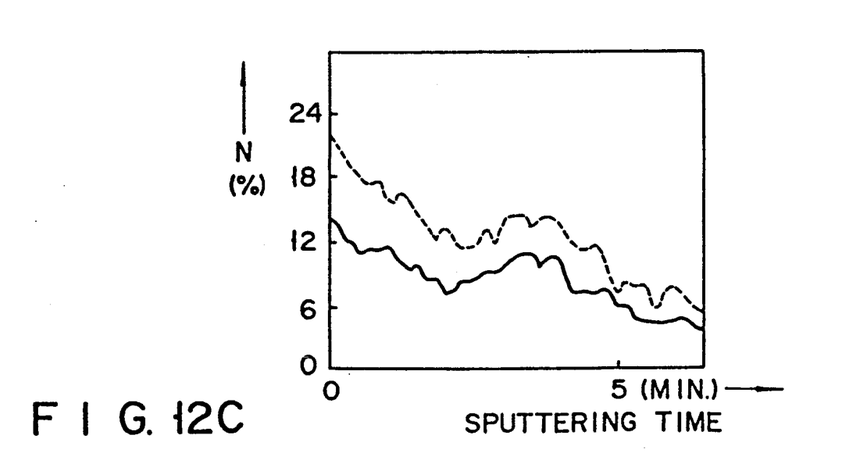

FIGS. 12A to 12C respectively show results obtained by measuring the nitrogen concentration of each tunnel oxide film in its depth direction by Auger analysis. FIG. 12A shows the characteristics of a sample obtained by setting the nitriding temperature in the 11th step, i.e., step 111 to be 1.050° C. FIG. 12B shows the characteristics of a sample obtained by setting the temperature at 1,150° C. FIG. 12C shows the characteristics of a sample obtained by setting the temperature at 1,250° C. In these drawings, broken curves are associated with samples without a heat treatment, whereas solid curves represent the characteristics of samples subjected to the heat treatments.

Note that this experiment was performed such that a heat treatment was performed at 1,000° C. for 10 minutes by using an electric furnace.

As is apparent from the results of this experiment, the nitrogen concentration of each sample subjected to the heat treatment becomes low compared with the samples without a heat treatment. This tendency becomes conspicuous with an increase in nitriding temperature. In this case, the hydrogen concentration of each film cannot be measured because a hydrogen atom is too light. However, as is apparent from the characteristics shown in FIGS. 12A to 12C, since nitrogen is removed, it can be determined that hydrogen atoms which are smaller than nitrogen atoms are more effectively removed.

Since nonreacted residues in a tunnel oxide film can be eliminated by a heat treatment in this manner, an electron trap amount can be effectively reduced. Hence, excellent characteristics of the $E^2PROM$ can be obtained.

Note that nonreacted residues can be more satisfactorily eliminated by the step of evacuation than by the step of introduction of an inert gas in the 13th step, i.e., step 113, and hence the step of evacuation is preferable.

As described above, a silicon oxide film is rapidly nitrided to form nitrided oxide layers on the upper and lower surfaces of the oxide film, thereby forming a tunnel oxide film having a three-layer structure. In this case, the endurance characteristics and the break-down characteristics can be improved. Such an improvement is considered to be based on the following reasons.

If a tunnel oxide film portion is constituted by only a silicon oxide film, distorted strain bonds are present near the interface between a silicon substrate and an $SiO_2$ film constituting the above tunnel oxide film to cause so-called Si—O trapping. However, it is considered that if rapid nitriding is performed, and a certain amount of nitrooxide is formed near the interface, distortion of the interface is reduced, and trapping is suppressed. In addition, the barrier height of this nitrided oxide film is smaller than that of the oxide film. Although the overall tunnel film is thick, its apparent thickness is considered to be small. It is considered, therefore, that trapping is further suppressed.

If, however, the entire oxide film was formed into a nitrided oxide film, it was found that the distortion was increased, the trap amount was considerably increased, and therefore, an optimal range was present.

Figure 13:
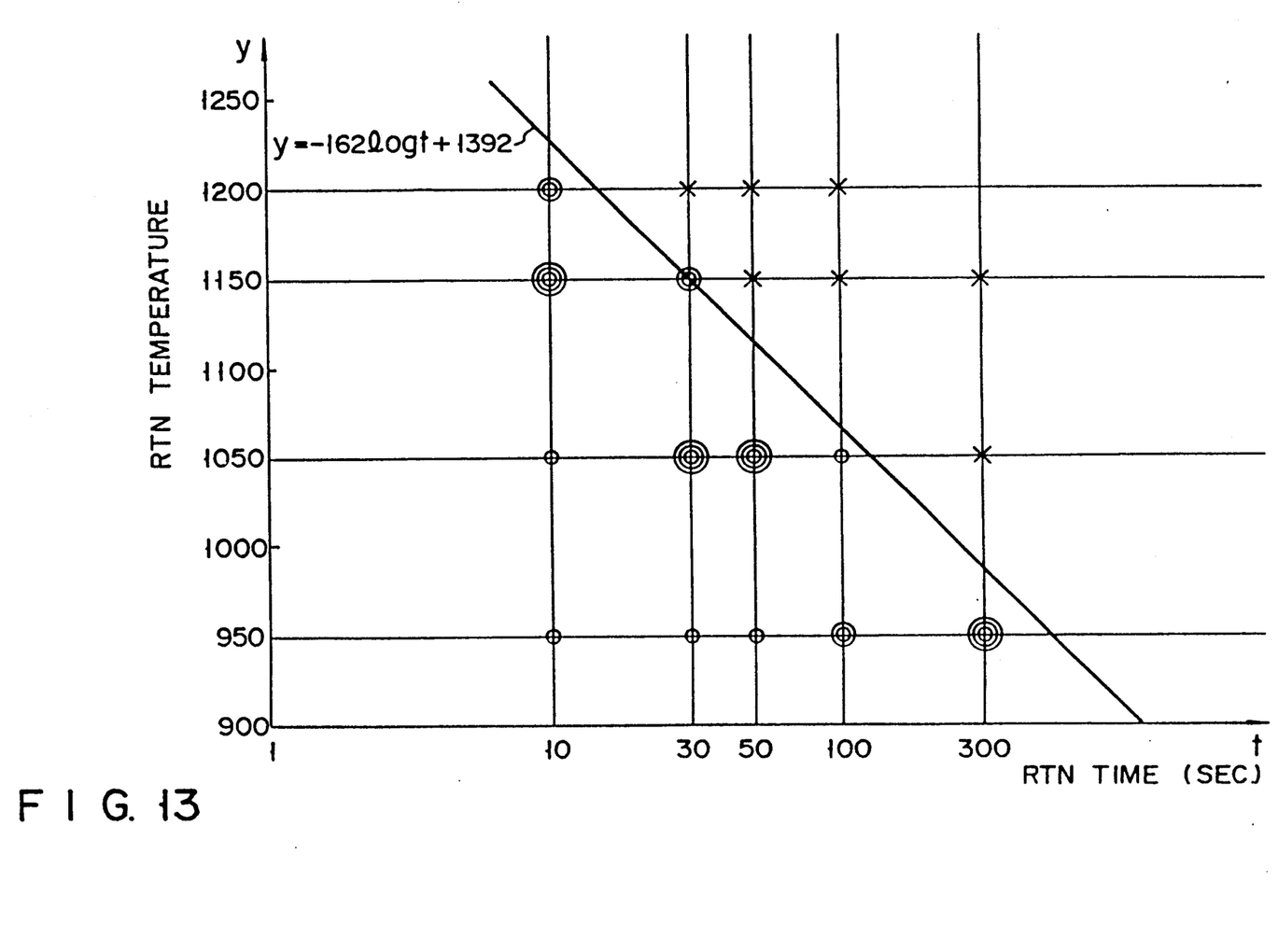
FIG. 13 is a graph for explaining conditions of the nitriding temperature and the rapid nitriding time, which are used to obtain a good three-layer structure.

FIG. 13 shows data based on an experiment, which represents a relationship between a nitriding (RTN) temperature y and a rapid nitriding (RTN) time t. In this experiment, a 4140B parameter analyzer available from Yokogawa Hewlett-Packard Co. was used to measure TDDB breakdown time by applying a positive potential to a gate at a room temperature so as to cause a current to flow at the current density $J=64$ mA cm$^2$. Note that the tunnel oxide films of samples used in this experiment had thicknesses of 80+10 Å, and these tunnel oxide films were subjected to the heat treatments in the 13th and 14th sceps, i.e., steps 113 and 114.

Assume that an average breakdown time of samples having tunnel oxide films which are not nitrided is set to be "1". Referring to FIG. 13, a line plot represents samples having breakdown time smaller than 1; single circle plots, samples having breakdown time larger than 1; double circle plots, samples having breakdown time larger than 2 (double breakdown time); and triple circle plots, samples having breakdown time larger than 3.

As is apparent from this experiment, within the range substantially satisfying the following relationship:

$$y \leq -162 \log t + 1392$$

the breakdown time of a sample can be prolonged and its characteristics can be improved compared with a sample formed without nitriding a tunnel oxide film.

What is claimed is:
1. A semiconductor memory device comprising:
a semiconductor substrate;
a tunnel insulating film, formed on the surface of the semiconductor substrate, having a three-layer structure wherein an oxide film is interposed between nitrided oxide films;
a gate oxide film which is put in direct contact with the surface of the semiconductor substrate, and which extends outwards from a peripheral portion of the tunnel insulating film;
a floating gate on the tunnel insulating film, said floating gate being divided at least into a first region and a second region, said first region having a low impurity-concentration and being situated in contact with the tunnel insulating film, and said second region having an impurity-concentration higher than that of the first region;

a film interposed between the first and second regions of the floating gate, said film having a such thickness that the film prevents diffusion of an impurity from the second region into the first region and enables the movement of carriers between the first and second regions; and a control gate formed above the floating gate with the insulating layer interposed between, said control gate, when supplied with a voltage, allowing carriers for data storage to flow from the semiconductor substrate into the floating gate through the tunnel insulating film, wherein said tunnel insulating film, said floating gate and said control gate form a semiconductor device, and a region including the gate oxide film forms a MOS transistor.

2. A memory device according to claim 1, wherein said gate oxide film has the same structure as that of the oxide film interposed between said nitride oxide films.

3. A memory device according to claim 1, wherein said film is an oxide film.

4. A memory device according to claim 3, wherein the thickness of the oxide film is 5 to 20 Å.

5. A memory device according to claim 1, wherein said gate oxide film is formed on said semiconductor substrate, and extends around said first region of said floating gate in contact with the periphery thereof.

6. A memory device according to claim 2, wherein said gate oxide film extends around said first region of said floating gate.

7. A memory device according to claim 6, wherein said gate oxide film is formed on said semiconductor substrate and extends around said first region of said floating gate in contact with the periphery thereof, and said film interposed between said first and second regions is an oxide film.

8. A memory device according to claim 1, wherein said gate oxide film is formed on said semiconductor substrate and extends around said first region of said floating gate in contact with the periphery thereof, and said film interposed between said first and second regions is an oxide film.

9. A semiconductor memory device comprising:

a semiconductor substrate;

a tunnel insulating film formed on said semiconductor substrate, and having a three-layer structure comprising two nitrided oxide films and an oxide film interposed between said nitrided oxide films;

a gate oxide film of a three-layer structure comprising two nitrided oxide films and an oxide film interposed between said nitrided oxide films, said gate oxide film being formed on said semiconductor substrate and extending around said tunnel insulating film in contact with the periphery thereof;

a floating gate comprising a first region formed on said tunnel insulating film, and a second region extending above said first region and having a width greater than the first region, said second region having an impurity concentration higher than said first region;

an insulating film interposed between said first and second regions of the floating ate, and having such a thickness as to prevent diffusion of an impurity from said second region into said first region and to enable carriers for the data storage to move between said first and second regions; and a control gate formed above said second region with an insulating layer interposed therebetween, said control gate, when supplied with a voltage, allowing the carriers to flow from said semiconductor substrate into said floating ate through said tunnel insulating film.

* * * * *